United States Patent [19]

Mokuo et al.

[11] Patent Number: 5,327,921
[45] Date of Patent: Jul. 12, 1994

[54] PROCESSING VESSEL FOR A WAFER WASHING SYSTEM

[75] Inventors: Shouri Mokuo, Saga; Kenji Yokomizo, Oonojo; Osamu Tanaka, Tosu, all of Japan

[73] Assignees: Tokyo Electron Limited, Tokyo; Tokyo Electron Saga Limited, Tosu, both of Japan

[21] Appl. No.: 26,016

[22] Filed: Mar. 4, 1993

[30] Foreign Application Priority Data

Mar. 5, 1992 [JP] Japan ................................. 4-83215
Mar. 16, 1992 [JP] Japan ................................. 4-90250

[51] Int. Cl.$^5$ ............................................. B08B 3/04
[52] U.S. Cl. ..................................... 134/182; 134/902
[58] Field of Search ........................... 134/182, 902

[56] References Cited

FOREIGN PATENT DOCUMENTS

| 61-42917 | 3/1985 | Japan . |
| 61-34946 | 2/1986 | Japan . |
| 61-59838 | 3/1986 | Japan . |
| 57624 | 3/1989 | Japan .................... 134/902 |
| 184926 | 7/1989 | Japan .................... 134/902 |
| 56321 | 2/1992 | Japan .................... 134/902 |

*Primary Examiner*—Philip R. Coe
*Attorney, Agent, or Firm*—Oblon, Spivak, McClelland, Maier & Neustadt

[57] ABSTRACT

A processing vessel suitable for use with a washing system intended to wash a plurality of wafers. The processing vessel includes a washing solution supply source, a circulation pump, a filter, a main vessel portion provided with inlets in the bottom thereof, a boat for holding the plurality of wafers in the center area of the main vessel portion and a flow control assembly arranged between the inlets and the wafers. The flow control assembly includes a scattering plate for scattering washing solution, which is introduced into the main vessel portion through the inlets, in the horizontal direction, and guiding passages through which the washing solution introduced through the inlets is made to have a substantially laminar flow and is guided into the center area of the main vessel portion. The guiding passages are formed by intervals between side plates and the scattering plate and by a plurality of apertures in the scattering plate. These guiding passages enable most of the washing solution to positively flow through spaces between the adjacent wafers. The flow control assembly also include a flow rate reducing section for reducing the amount of the washing solution which flows along the peripheral area of the wafers.

10 Claims, 10 Drawing Sheets

PROCESSING VESSEL FOR A WAFER WASHING SYSTEM

BACKGROUND OF THE INVENTION

1. Field of the Invention

The present invention relates to a processing vessel suitable for use with the washing system intended for washing semiconductor wafers with chemical solutions and water and drying them by heat.

2. Description of the Related Art

Semiconductor devices such as super LSIs have been more and more highly integrated and their circuit patterns have been micro-structured to the order of submicrons. In addition, the diameters of semiconductor wafers have been made larger than 8 inches and up to 12 inches. When a quite small amount of particles which could be conventionally neglected adheres to the semiconductor wafers, therefore, the productivity of wafers is lowered to a great extent. In order to overcome this, the semiconductor wafers are immersed in acid and alkali solutions in the processing vessels to clean their surfaces.

The automatic washing system can be cited as this type of system for washing and cleaning the surface of each wafer. It includes a plurality of processing vessels in which the semiconductor wafers are washed by chemical solutions and by water and dried by heat. In short, it includes an ammonia processing vessel, a water-washing vessel, a rinsing vessel, a hydrofluoric acid processing vessel and a drying chamber to sequentially apply a series of processes to the semiconductor wafers.

Figure 1:
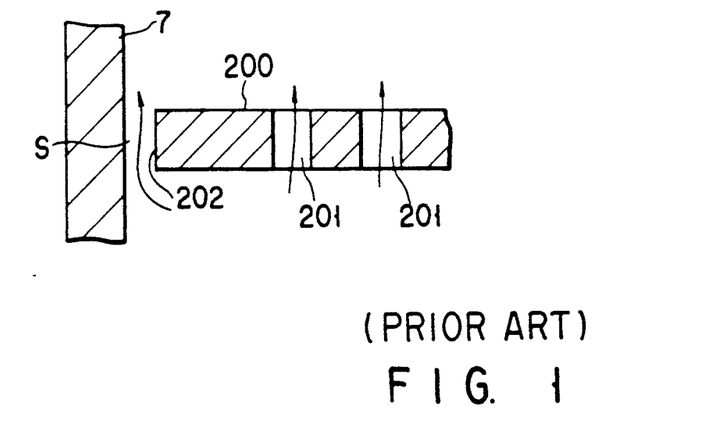
FIG. 1 is a vertically-sectioned view showing a part of the conventional vessel when enlarged.

According to a processing vessel disclosed in Japanese Patent Disclosure Sho 61-59838, a straightening plate 200 is arranged adjacent to the bottom of the processing vessel 7 and a washing solution is supplied into the process vessel 7 through supply holes (not shown) and then into intervals between the adjacent wafers, which are held above the plate 200, through a plurality of apertures 201 in the plate 200, as shown in FIG. 1. According to this processing vessel 7, the washing solution which is passed through the apertures 201 in the perforated plate 200 can be straightened so as to have a laminar flow. Even when the dimensions, position and number of apertures 201 are accurately set in this perforated plate 200, however, it is difficult to uniformly straighten (laminar flow) the washing solution flow in the whole area of the processing vessel 7. In addition, air bubbles which have passed through the apertures 201 in the perforated plate 200 adhere to the wafers to degrade the quality of these wafers. Further, the perforated plate 200 is made of quartz, which makes it difficult to accurately make apertures 201. This difficult working which must be done on the quartz makes the cost high.

In order to enhance the throughput, therefore, it is required that neither particles nor oil adhere to the wafers. However, it is extremely difficult to make the quartz-processing accuracy high. When quartz is to be processed, a quartz plate is cut off, washed by hydrofluoric acid solution and then annealed by heat. The shape of the quartz plate, however, is little changed by the heat-annealing process. This makes it difficult to make the perforated plate 200 and, therefore, the vessel 7 with high accuracy.

It is required needed, therefore, that dimensional errors (or working tolerances) caused at the time of processing are taken into consideration. Even if they are taken into consideration, however, a slight clearance S is unavoidably caused between the inner wall of the vessel 7 and an end face 202 of the straightening plate 200. The clearance S has a width of about 1 mm along the inner wall of the vessel 7. The sectional area of this clearance S is so large as not to be neglected when compared with the total of sectional areas of apertures 201 in the plate 200. A large amount of washing solution is thus allowed to flow through the clearance S. As the result, most of the washing solution flows not into spaces between the adjacent wafers but along the peripheral portion of the wafers. The amount of the washing solution which flows through spaces between the adjacent wafers is thus made quite small. This causes vortexes and the washing solution remains in the processing vessel 7 so as to thereby lower the wafer-washing efficiency of the wafers and "the resistivity-restoring characteristic" of the washing solution. A long period of time is thus needed to wash the wafers.

"The phrase resistivity-restoring characteristic" used here is represented by a time period needed to increase (or decrease) the purity (degree of contamination) of the washing solution higher (or lower) than a certain level while removing impurities from the washing solution. In a case where the washing solution is water, for example, an index (or resistivity value) which represents the rate of an electric resistance value obtained when current is applied to pure water (or theoretically pure water) relative to that obtained when current is applied to the washing solution is detected and the time period needed to purify the washing solution until the index thus detected becomes near or equal to the value of 1. The "resistivity-restoring characteristic" is denoted by this time period.

Most of the washing solution is caused to flow along the peripheral area of the processing vessel to thereby allow only quite a small amount of it to flow through the center area thereof. This is because a plurality of wafers are positioned in the center area of the vessel and because fluid resistance becomes larger in the center area of the processing vessel than in the peripheral area thereof. The amount of the washing solution which passes between the wafers is made insufficient or not uniform so as to thereby make it impossible to sufficiently and uniformly remove dust and particles from the wafers. This washing process being made insufficient or not uniform can be seen all over the surface of a wafer and also when the surface of one wafer is compared with that of the other one.

SUMMARY OF THE INVENTION

The object of the present invention is therefore to provide a process vessel suitable for use with the washing system and capable of supplying washing solution into spaces between adjacent wafers at a flow rate which is sufficient enough to allow the wafers to be uniformly and completely washed and cleaned.

According to an aspect of the present invention, there can be provided a processing vessel suitable for use with the washing system comprising means for supplying washing solution to wash the substrates; a main vessel portion provided with an inlet in the bottom thereof which is communicated with the washing solution supply means; boat means for holding the substrates, which are to be washed, in a center area of the main vessel portion; and a flow control assembly arranged between the inlet provided bottom of the main vessel portion and the substrates in the main vessel portion; wherein the flow control assembly has a scattering plate for scattering the washing solution, which is introduced into the main vessel portion through the inlet, in the horizontal direction, and passages through which the washing solution introduced through the inlet is made so as to have a substantially laminar flow and is guided into the center area of the main vessel portion, so that most of the washing solution can flow through spaces between the adjacent substrates.

Most of the washing solution can be made to have laminar flow while passing through guiding passages of the flow control assembly (or intervals between the center plate and the side plates, intervals between the side plates, or a plurality of apertures in the scattering plate) and then concentrated into the center area of the main vessel portion. This sufficient amount of the washing solution is made to have a laminar flow is and passed through spaces between the adjacent wafers, so that the whole area of each wafer can be uniformly washed and cleaned. This can be further promoted when that amount of the washing solution which flows along the peripheral area of the wafers in the main vessel portion is reduced by the flow rate reducing section.

On the other hand, air bubbles are guided along the peripheral area of the main vessel portion by the side plates and then float along the side wall thereof while passing through bubble-escape passages (or intervals between the side wall of the main vessel portion and each of the side plates). This can prevent air bubbles from adhering to the substrates or wafers.

The interval between the scattering plate and the bottom of the main vessel portion is preferably in a range of 10–70 mm, most preferably in a range of 30–40 mm.

The interval (or guiding passage) between the scattering plate and each of the side plates is preferably in a range of 1–10 mm, most preferably in a range of 2–5 mm.

The interval between the side wall of the main vessel portion and each of the side plate) is preferably in a range of 0.5–3 mm, most preferably in a range of 1–2 mm.

The angle $\theta$ at which each side plate is tilted relative to the horizontal plane is preferably in a range of 0–20 degrees, most preferably in a range of 5–10 degrees.

The interval between each of the side plates and the substrates or wafers is preferably in a range of 0–100 mm, most preferably in a range of 20–30 mm.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DESCRIPTION OF THE PREFERRED EMBODIMENTS

Figure 2:
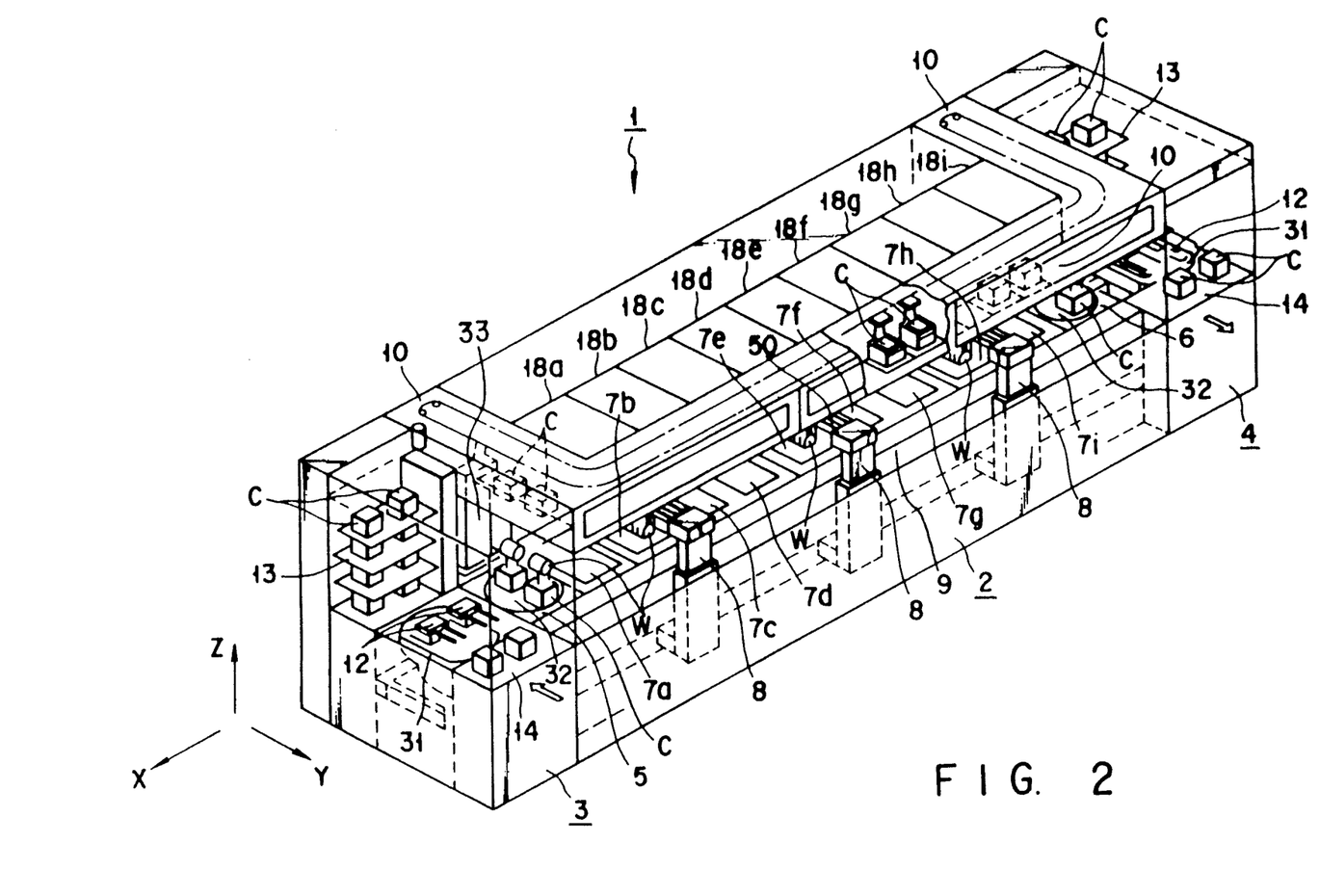
FIG. 2 is a perspective view showing the entire washing system in which some vessels according to a first embodiment of the present invention are used.

As shown in FIG. 2, a washing system 1 comprises three sections, that is, a washing section 2, an input buffer section 3 and an output buffer section 4. The input buffer section 3 is located on the side of a loader unit 5 in the washing section 2. The output buffer section 4 is located on the side of an unloader unit 6 in the washing section 2. The washing section 2 includes a lower area where semiconductor wafers are washed and an upper area where wafer cassettes are washed. Both ends of passage 10 in the cassettes washing area of the washing section 2 are communicated with the input and output buffer sections 3 and 4.

Both of the input and output buffer sections 3 and 4 are of substantially the same structure. Therefore, description will be made only of the input buffer section 3.

Two cassettes C are mounted on a cassette port 14 in the input buffer section 3. Each of the cassettes C houses twenty five sheets of silicon wafers W therein. Two units 12 for carrying the cassettes C are arranged opposite to the cassette port 14. These two cassette carrier units 12 are mounted on a turntable 31 which is located between the cassette port 14 and a cassettes stocking unit 13.

As shown in FIG. 2, the loader and unloader units 5 and 6 are located on both sides of the washing section 2 and nine processing vessels 7a–7i are arranged between the sections 5 and 6. The processing vessels 7a–7i are on a line and wafers W can be sequentially washed while passing through the processing vessel 7a, 7b, 7c, 7d, 7e, 7f, 7g, 7h and 7i in this order. The processing vessels 7a and 7h are intended to wash and dry a wafer chuck 27, 28, vessels 7b and 7e wash wafers by chemical solution, vessels 7c, 7d, 7f and 7g to wash wafers by water, and vessel 7i to dry them. They are housed in their corresponding chambers 18a–18i. Chemical solutions such as Ammonia, hydrogen peroxide, hydrochloric acid, hydrofluoric acid and sulfuric acid can be used in the processing vessels 7d and 7e.

Three wafer carrier units 8 are arranged along the line of these processing vessels 7a–7i. Each of the wafer carrier units 8 has the wafer chuck 27, 28 by which up to fifty sheets of wafers W, maximum, can be held together. A switching window made by a transparent acryl plate is attached to the front of the washing section 2 and the processing vessels 7a–7i can be viewed from outside through this window.

The passage 10 is arranged in the upper area of the washing section 2 to wash and dry the cassettes C therein. A plurality of drain pipes are arranged under the washing section 2 and a plurality of tanks in which chemical solutions and pure water are continued are arranged on the rear side of the washing section 2. Further, a cassette lifter 33 is provided to lift the cassettes C from the loader unit 5 into the cassettes washing passage 10.

Figure 3:
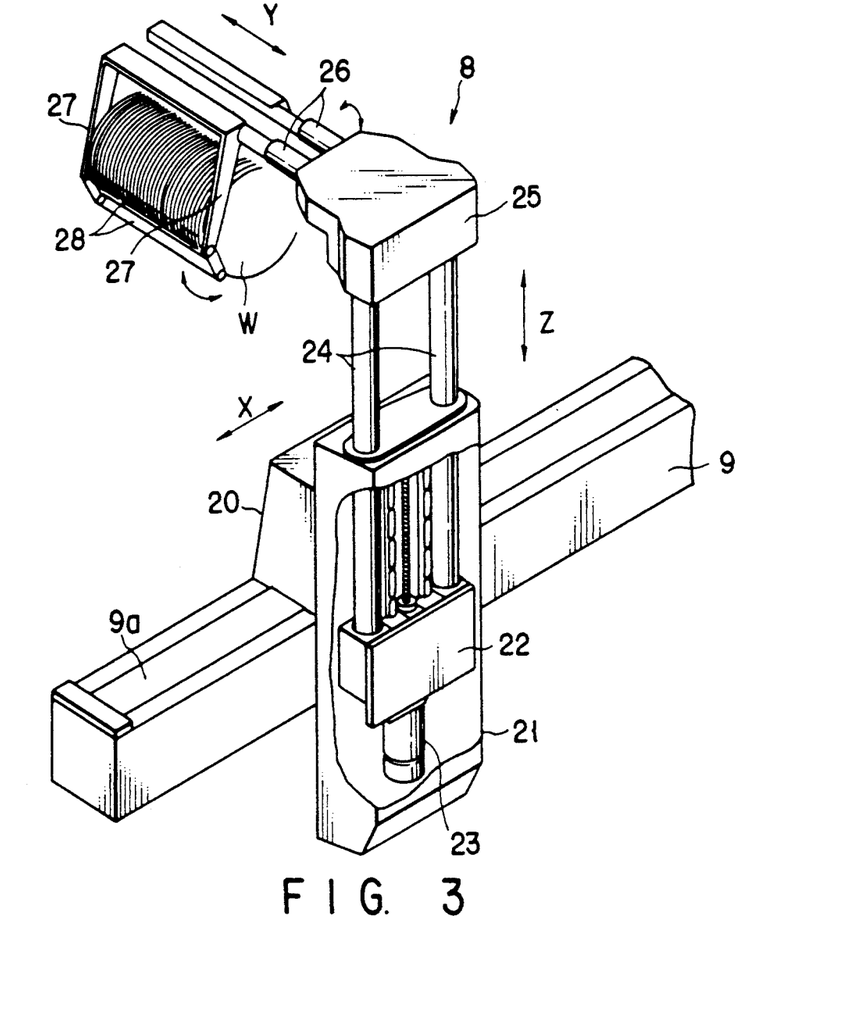
FIG. 3 is a perspective view showing a wafer carrier unit provided with a wafer chuck.

The wafer carrier unit 8 will now be described with reference to FIG. 3.

A base 9 of the wafer carrier unit 8 is arranged along the line of the processing vessels 7a–7i. The wafer carrier unit 8 includes an X-axis mover 20, a Z-axis mover 21 and a chuck drive mechanism 25. The chuck drive mechanism 25 reciprocates a pair of arms 26 along the Y-axis and swings them round it. Chuck members 27 and 28 are attached to each of the front ends of the paired arms 26 and wafers W are held in grooves on the chuck members 28. Fifty grooves are formed on each of the chuck members 28. The X-axis mover 20 is mounted on the carrier base 9 to move the wafer carrier unit 8 along the X-axis through a rack/pinion mechanism (not shown). A seal belt 9a closes the open top of the carrier base 9 to prevent particles caused by the X-axis mover 20 from being scattered outside. The chuck members 27 and 28 are made of quartz or PEEK. A reduction gear box 22 and a motor 23 are housed in a case of the Z-axis mover 21 to move a pair of shafts 24 along the Z-axis.

A case where the processing vessels according to a first embodiment of the present invention are used as chemical solution vessels 7b, 7e and water vessels 7c, 7d, 7f, 7g will be described referring to FIGS. 4 through 6. For the sake of simplicity, however, description will be made only on the chemical solution vessel 7b.

Figures 4, 6:
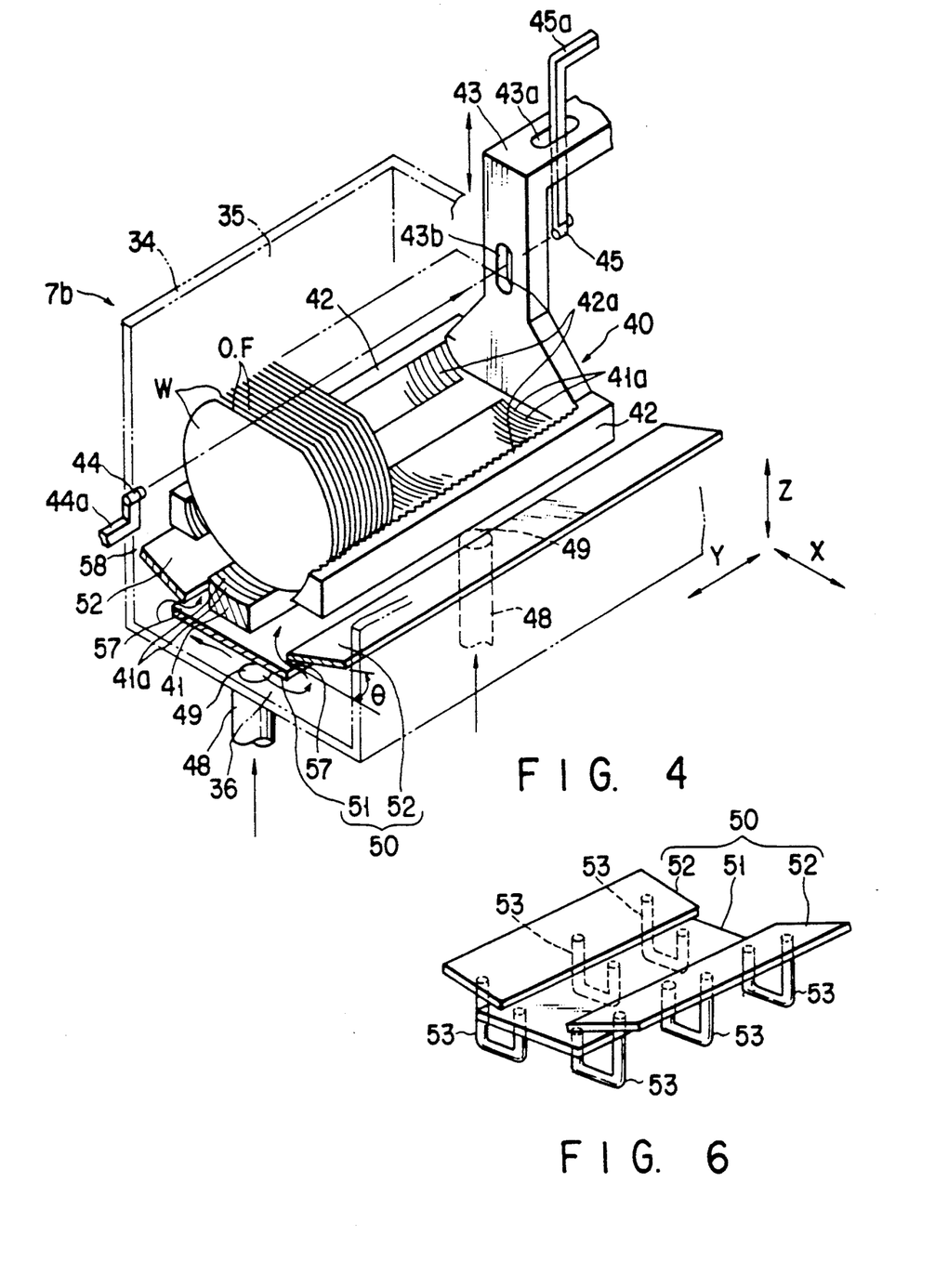
FIG. 4 is a perspective view showing the vessel partly cut open to show the inside thereof.
FIG. 6 is a perspective view showing a flow control assembly provided on the bottom of the vessel.
Figure 5:
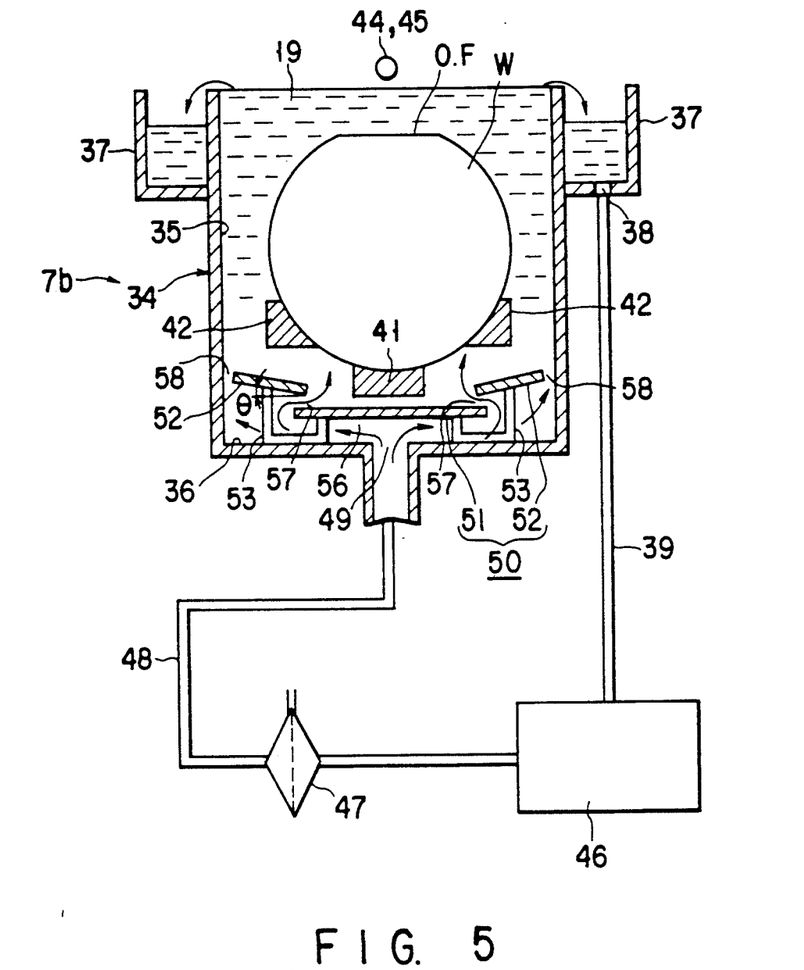
FIG. 5 is a vertically-sectioned view showing the vessel and how solution is circulated through the vessel.

As shown in FIGS. 4 and 5, the chemical solution vessel 7b comprises a main vessel portion 34 and an overflow vessel portion 37. The overflow vessel portion 37 encloses the main vessel portion 34 round the upper end thereof and serves to receive chemical solution 19 which has overflowed from the top of the main vessel portion 34. Two ports 49 are formed in a bottom 36 of the main vessel portion 34 and it is preferable that the distance between these two ports 49 is made equal to a sum of the regular intervals of twenty or thirty sheets of wafers W. Each of the ports 49 is communicated with the outlet side of a pump 46. A filter 47 is arranged between the pump 46 and the ports 49. The filter 47 serves to remove impurities such as ions and particles from chemical solution 19. The outlet side of the pump 46 is communicated with a drain 38 of the overflow vessel portion 37. Chemical solution 19 is therefore circulated by the pump 46, passing through the main vessel portion 34, the overflow vessel portion and the filter 47. Pure water in each of the water vessels 7c, 7d, 7f and 7g is circulated through the open system but a chemical solution (such as hydrofluoric acid solution and ammonia solution) is calculated in each of the chemical solution vessels 7b and 7e through the closed system.

A wafer boat 40 is supported in the chemical solution vessel 7b by a fixing arm 43. It includes three wafer holder members 41 and 42, on inner faces of which grooves 41a and 42a are formed at a certain pitch interval.

Light sensors 44 and 45 are located on both ends of the boat 40. The light-emitting element 44 is supported by a support member 44a and the light-receiving element 45 by a support member 45a. The support member 45a is passed through a slot 43a of the boat support arm 43. The optical axis of the light sensors 44 and 45 is along the Y-axis, passing just over tops of the wafers W in the boat 40. These light sensors 44 and 45 are intended to detect whether or not the wafers W are reliably mounted on the boat 40 when the wafers W are to be transferred from the wafer chuck members 27 and 28 onto the boat 40. when normally mounted on the boat 40, the wafers W direct their orientation flats (which will be hereinafter referred to as O.F.) upward.

The wafer chuck members 27 and 28 are moved along the Y-axis to correct their positions at which the wafers w are to be transferred from them onto the boat 40. In short, the wafer boat 40 is sometimes positionally shifted from the carrier base 9. This makes it necessary for the chuck members 27 and 28 to be moved along the Y-axis to correct their positions relative to the wafer boat 40. The extent to which the chuck members 27 and 28 must be moved along the Y-axis for their positional adjustment are previously obtained in each of the process vessels 7b–7g and the values thus obtained are stored in the memory of a drive control unit (not shown).

A flow control assembly 50 is arranged between the ports 49 and the wafer boat 40. It is a combination of a center plate (or scattering plate) 51 and two side plates 52. The center plate 51 is located just over the ports 49 and the side plates 52 are located on both sides of the center plate 51 and slightly above it.

As shown in FIG. 6, the center plate 51 is supported horizontally by support members 53. On the other hand, the side plates 52 are supported by the same support members 53 in such a way that they are tilted relative to the horizontal plane only by an angle $\theta$. The plates 51, 52 and the support members 53 are made of quartz or fluorine-contained resin. The support members 53 serve as intervals defining spacers. More specifically, an interval or space 56 between the center plate 51 and the bottom 36 of the vessel 7b is in a range of 10–70 mm. An interval 57 between the center plate 51 and each of the side plates 52 is in a range of 1–10 mm. An interval 58 between the side end of each of the side plates 52 and a side wall 35 of the vessel 7b is in a range of 0.5–3 mm The angle $\theta$ at which each of the side plates 52 is tilted relative to the horizontal plane is in a range of 0–20 degrees. An interval between the wafers W and each of the side plates 52 is in a range of 0–100 min.

Most of water supplied through the ports 49 passes through intervals 57 and flows to the center of the main vessel portion 34, Air bubbles in the water supplied are guided by the side plates 52 to pass through intervals 58 and elevate along side walls 35.

As shown in FIG. 6, the center and side plates 51 and 52 are supported by the six support members 53 in such a way that those portions of the side plates 52 which are lowered are slightly overlapped with the center plate 51.

The wafers washing process will be described.

This process is carried out under normal temperatures and pressures. Two cassettes C are mounted on the cassette port 14 in the input buffer section 3 by a carrier robot (not shown). Each of the cassettes C houses twenty five sheets of silicon wafers W therein. O.Es of these semiconductor wafers w in each of the two cassettes C are aligned with one another on the cassette port 14 by aligning units (not shown) for the wafers. The cassettes C are carried to the loader section 5 by the carrier units 12. They are housed, however, in the stock unit 13 when other ones are already present at the loader section 5.

The wafers W in the cassettes C are lifted up at the loader section 5 and fifty sheets of them are held together by the chuck 27, 28 of the carrier unit 8. They are carried into the second processing chamber 18b at the washing section 2. They are successively carried by the three carrier units 8 and processed by a chemical solution, by water, by water, by chemical solution, by water, by water and then dried in the chambers 18b–18i.

Now will be described how the wafers W are washed in the chemical solution vessel 7b at the second processing chamber 18b.

The wafers W are mounted from the chuck members 27 and 28 onto the boat 40. Fifty sheets of 8-inch wafers W are loaded on the boat 40 at regular intervals of 6.35 mm. Fifty sheets of 6-inch or 5-inch wafers W are loaded on the boat 40 at regular intervals of 4.76 mm, respectively. It is detected and confirmed by the light sensors 44 and 45 that the wafers W have been correctly mounted on the boat 40. When correctly mounted on the boat 40, they are completely immersed in the chemical solution 19. The pump 46 is driven to supply the chemical solution 19 into the main vessel portion 34 at a flow rate of 5-20 liters per minute.

The chemical solution 19 is introduced into the main vessel portion 34 through two ports 49 and divided equally right and left by the center plate 51. It then elevates from both side ends of the center plate 51 and passes through the passages 57. Its speed is increased due to an ejector effect when it passes through the passages 57, and it is thus straightened. As the result, it is equally supplied into the intervals between the adjacent wafers W.

Air in the chemical solution 19 can be removed by the filter 47, but a small amount of air still enters together with the chemical solution 19 into the main vessel portion 34. The air bubbles thus entered, however, are guided into the passages 58 by the side plates 52 to pass through them and be elevated along the side walls 35 of the main vessel portion 34. This prevents air bubbles from adhering to the wafers W. The solution 19 which flows over the main vessel portion 34 is received by the overflow vessel portion 37 and returned into the main vessel portion 34 through the filter 47 by the pump 46.

According to this first processing vessel 7b, each surface of the 8-inch wafers W is able to be uniformly washed over a shorter time period. In addition, all fifty sheets can be equally washed.

Figure 7:
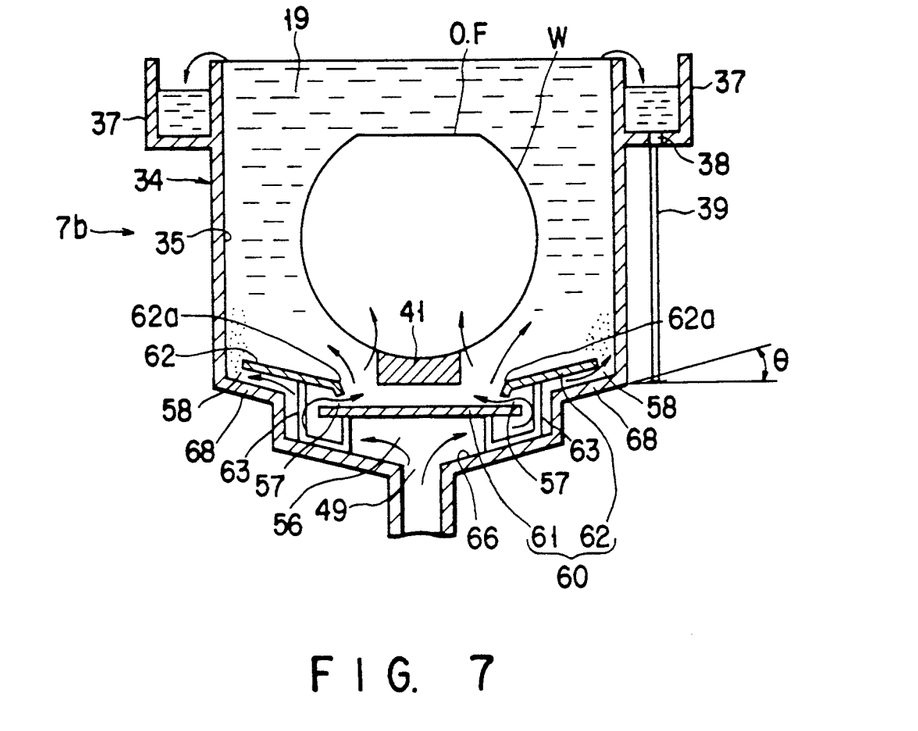
FIG. 7 is a vertically-sectioned view showing a variation of the vessel.

Referring to FIG. 7, a variation of the first processing vessel whose bottom shape is changed will be described.

In the case of this variation, an inner side end portion 62a of each of side plates 62 is bent downward. The washing solution 19 which has passed through the passages 57 can be thus more widely scattered into the main vessel portion 34, and further the laminar flow state of the solution 19 can be improved.

Further, the main vessel portion 34 has a bottom 66 shaped so as to be parallel to the side plates 62. In short, the bottom 66 is tilted inward and relative to the horizontal plane by an angle $\theta$, as seen in the case of the side plates 62. It also includes stepped portions 68 to make narrower the passages 58 which are formed between the side plates 62 and the stepped portion 68. When the bottom 66 of the main vessel portion 34 is shaped in this manner, air bubbles in the solution 19 can be more reliably guided into the passages 58 and they can be thus kept remote from the wafers W. A center plate 61 and the side plates 62 are fixed to the bottom 66 of the main vessel portion 34 by six support members 63.

The interval 56 between the center plate 61 and the bottom 66 is in a range of 10–70 mm. The interval 57 between the center plate 61 and the inner side end 62a of each of the side plates 62 is in a range of 3–15 mm. The interval 58 between each of the side plates 62 and the side wall 35 is in a range of 0.5–3 mm. The angle at which the side plates 62 and the bottom 66 are tilted is in a range of 0–20 degrees. In addition, the bottom 66 may not have any stepped portions 68. The effect of guiding air bubbles can be achieved even when the bottom 66 is only tilted inward.

Figure 8:
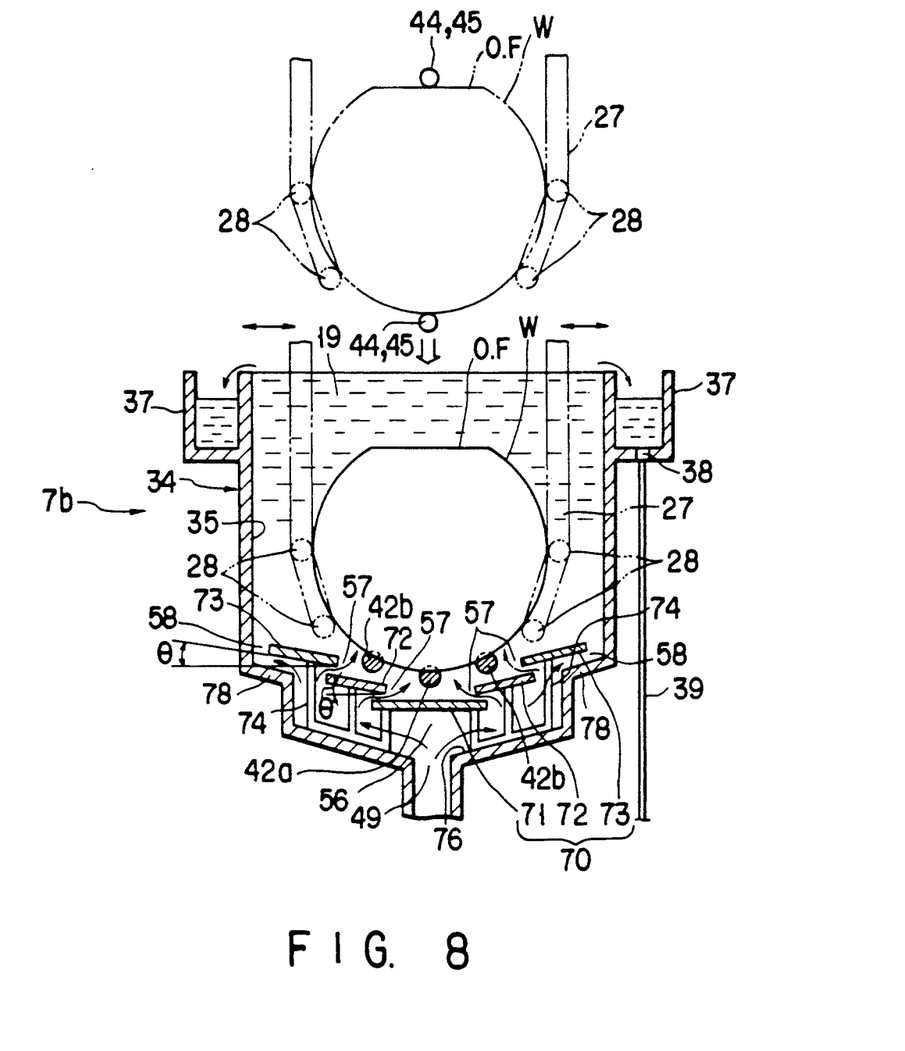
FIG. 8 is a vertically-sectioned view showing another variation of the vessel.

Another variation of the first process vessel whose bottom shape is also changed will be described referring to FIG. 8.

In the case of this second variation, first and second side plates 72 and 73 are arranged on both sides of a center plate 71. The center plate 71 and the first and second side plates 72 and 73 are fixed to a bottom 76 of the main vessel portion 34 by six support members 74.

The bottom 76 is shaped parallel to the first and second side plates 72 and 73. In short, it is tilted inward and relative to the horizontal plane by an angle $\theta$, as seen in the case of the first and second side plates 72 and 73. It also includes stepped portions 78 to make narrower the passages 58 each being formed between the second side plate 73 and the stepped portion 78.

When the bottom 76 is shaped in this manner, air bubbles in the solution 19 can be still more reliably guided into the passages 58 and kept remote from the wafers W. Further, the solution 19 is passed through four guiding passages 57. This enables the solution 19 to be still further straightened.

The bottom 76 may be shaped to have three or more stepped portions. The width of the center plate 71 may be made smaller or plural apertures may be formed in the center portion of the center plate 71.

Figure 9:
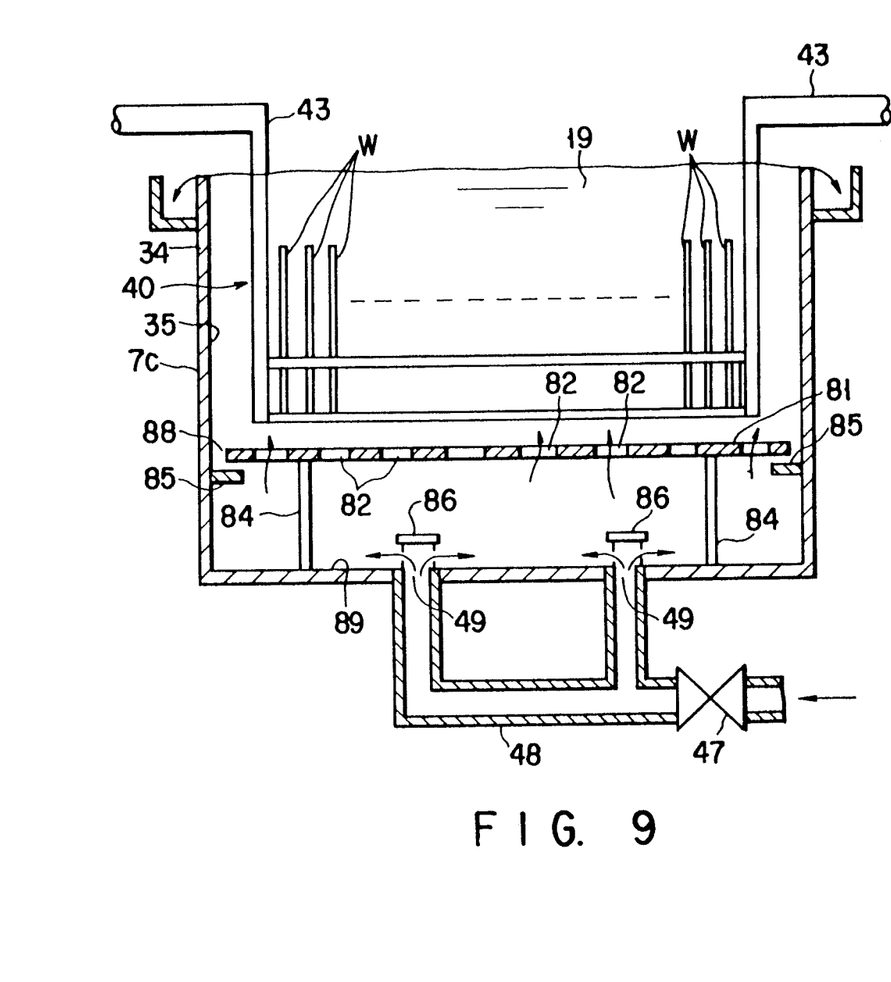
FIG. 9 is a sectional view taken along the longitudinal direction to show the vessel according to a second embodiment of the present invention.
Figure 10:
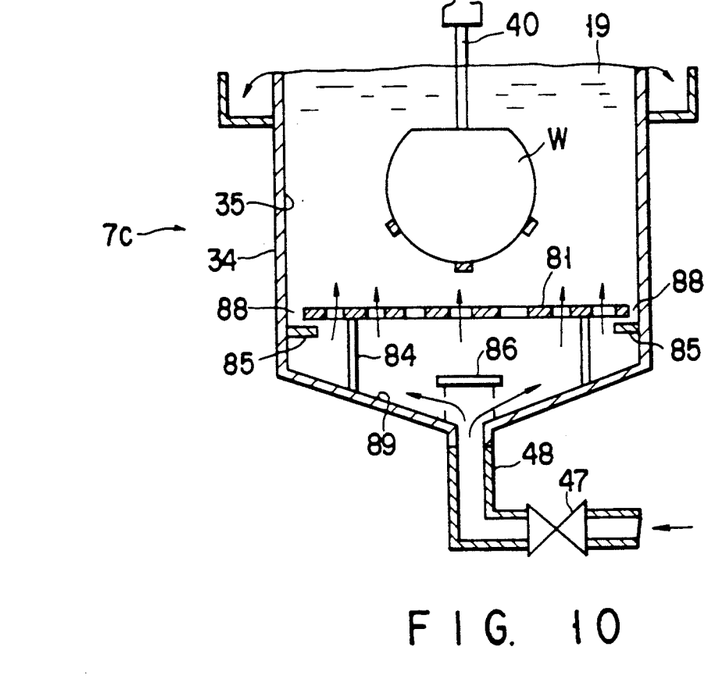
FIG. 10 is a vertically-sectioned view showing the second vessel.

The processing vessel 7c according to a second embodiment of the present invention will now be described with reference to FIGS. 9 through 11. Description of the same components as utilized in the first processing vessel will be omitted for the sake of simplicity.

Process vessel 7c is used to wash the wafers with pure water. It includes a bottom 89 tilted downward to the center thereof. Two ports 49 are formed in the bottom 89 at an appropriate interval. Ion-free pure water 19 is supplied into the main vessel portion 34 through the ports 49. A scattering plate 86 is arranged right over the ports 49. The flow of the pure water 19 is changed from vertical to horizontal by the scattering plate 86, so that the pure water 19 can be scattered along the bottom 89 of the main vessel portion 34.

A perforated plate 81 is supported and fixed to the bottom 89 by support members 84. It is arranged horizontally and has an interval of 10–50 mm from its underside to the bottom 89. Several tens or hundreds of apertures each having a diameter of several millimeters are formed all over the perforated plate 81. The perforated plate 81 has a thickness of about 3 mm. It is made of a material such that it hardly creates any particles and is corrosion-proof against acid and alkali. Preferably, it is made of quartz.

Figure 11:
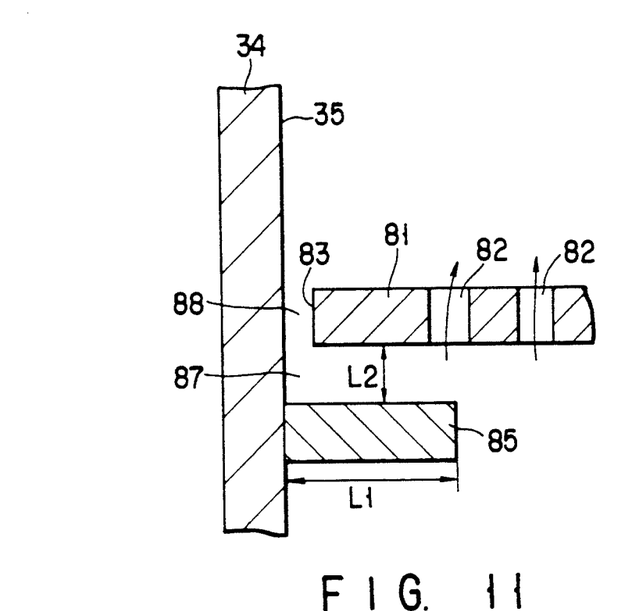
FIG. 11 is a sectional view showing a part of the second vessel enlarged.

As shown in FIG. 11, each side surface 83 of the perforated plate 81 is separated from the side wall 35 of the main vessel portion 34. A clearance 88 thus formed between them is in a range of 1–2 mm. A baffle plate 85 is arranged along and right under each clearance 88. It is projected from each side wall 35 by a length L1 and separated from the underside of the perforated plate 81 by a length L2. The length L1 is preferably in a range of 6–8 mm and the length L2 is preferably less than 2 mm. The perforated plate 81 is, moreover, preferably made of quartz.

Passages 87 are formed by the baffle plates 85 and the perforated plate 81. These passages 87 are narrow. The pressure loss of the solution 19 which passes through the passages 87 is thus made substantially larger than that of the solution 19 which passes through the apertures 82 of the plate 81. This enables a large amount of the solution 19 to flow through the center area of the main vessel portion 34, while allowing only a small amount of it thus left to flow along the peripheral area thereof. As the result, a sufficient amount of the solution 19 can be supplied into the intervals between the adjacent wafers W.

Figure 12:
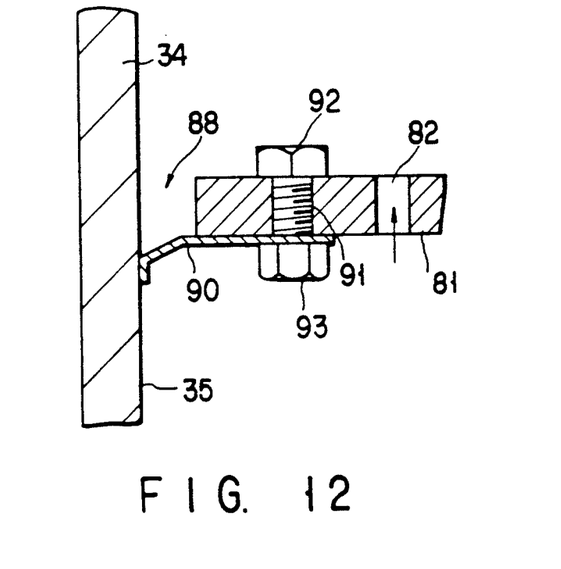
FIG. 12 is a sectional view showing a part of a variation of the second vessel enlarged.

As shown in FIG. 12, a flexible sheet member 90 may be attached to the under-surface of each peripheral portion of the plate 81 by a bolt 92 and a nut 93. It is made of material such as fluorine-contained resin which is highly resistant against chemical solutions. It is resilient and its free end is pushed against the side wall 35. Each clearance 88 is thus closed by the flexible sheet member 90. The bolt 92 and the nut 93 are made of PEEK (polyether-ether-ketone) or ethylene tetrafluoride resin.

A case where the wafers W are water-washed in the processing vessel 7c at the third process chamber 18c will now be described referring to FIG. 9.

Fifty sheets of wafers W are transferred from the chuck members 27 and 28 onto the boat 40. When correctly mounted on the boat 40, the wafers w are completely immersed in pure water 19. The pure water 19 is introduced into the main vessel portion 34 through the two ports 49 and scattered along the bottom 89 of the main vessel portion 34 by the scattering plate 86. Further, it passes through the apertures 82 in the plate 81 and becomes elevated so as to flow through the intervals between the adjacent wafers W. It flows with a laminar flow between the adjacent wafers w without causing any residence and vortex in the main vessel portion 34. The surface of each wafer W can be thus washed for a shorter time.

Figure 13A:
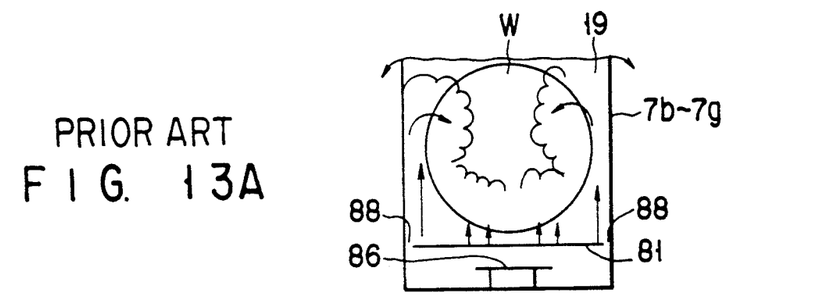
FIG. 13A is a view intended to explain the flow of solution the wafers are subjected to inside the conventional vessel.
Figure 13B:
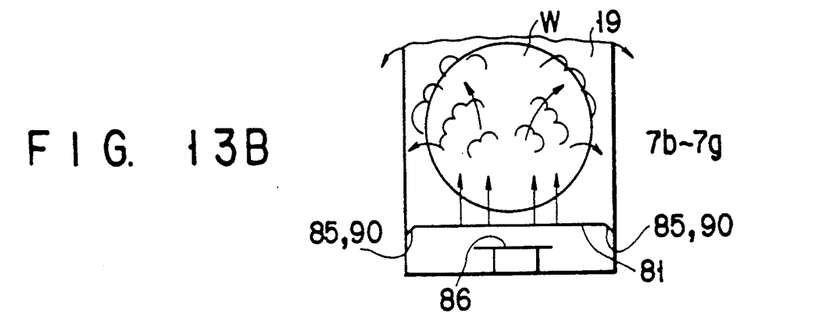
FIG. 13B is a view intended to explain the flow of solution the wafers are subjected to inside the vessel according to the present invention.

Results obtained while comparing the conventional processing vessel with the processing vessel 7c will now be described with reference to FIGS. 13A and 13B. The pure water 19 was colored by ink to make its flow visible. FIG. 13A shows the flow of the pure water 19 in the conventional processing vessel while FIG. 13B shows that of the pure water 19 in the processing vessel 7c according to the present invention. Each clearance 88 was provided with the baffle plate 85 or the sheet member 90.

As shown in FIG. 13A, the amount of the pure water 19 which passes through the clearance 88 is large in the case of the conventional process vessel. The flow of the pure water 19 thus supplied to the wafers W is likely to stay. This causes the wafers washing efficiency in the process vessel to become low. As shown in FIG. 13B, however, the flow of the pure water 19 which passes through the clearance 88 is suppressed or completely stopped by the baffle plates 85 or the flexible sheet members 90 in the case of the processing vessel 7c. A sufficient amount of the pure water 19 can be thus allowed to smoothly flow through the intervals between the adjacent wafers w. This enables the wafers washing efficiency in the processing vessel 7c to become high.

Figure 14:
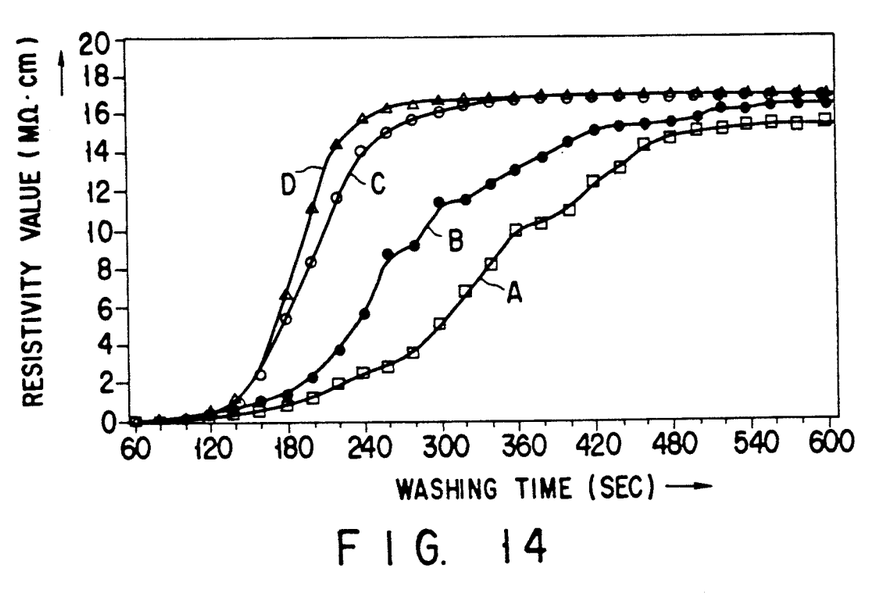
FIG. 14 is a graph showing results obtained relating to washing times and resistivities of solutions so as to compare the conventional vessel with the one according to the present invention.

In FIG. 14, the washing times (or seconds) are plotted on the horizontal axis and resistivity values (M$\Omega$·cm) of pure water overflowed on the vertical axis to show results obtained relating these values. A curve A represents the results obtained in the conventional process vessel, a curve B these obtained when the length L1 of each baffle plate 85 is set 3 mm, a curve C obtained when it is set 6 mm, and curve D obtained when the flexible sheet members 90 are used. It was determined that the washing process has been finished when the resistivity value reaches 15 M$\Omega$·cm.

As apparent from FIG. 14, about 460 seconds are needed in the conventional processing vessel, as denoted by the curve A, until the resistivity value reaches 15 M$\Omega$·cm. In the case of the processing vessel 7c, however, about 380, 240 and 220 seconds are needed in the above-mentioned each case, as denoted by curves B, C and D, until the resistivity value reaches 15 M$\Omega$·cm. Particularly in the latter two cases (denoted by curves C and D), the time needed to restore the resistivity could be shorted to a greater extent.

Figure 15:
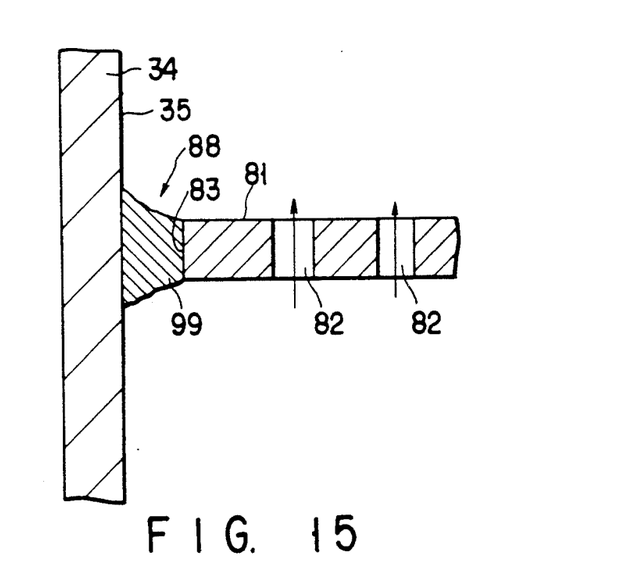
FIG. 15 is a vertically-sectioned view showing a part of the vessel according to a further embodiment of the present invention enlarged.

As shown in FIG. 15, it is possible that a welded bond 99 be formed between each end face of the perforated plate 81 and the side wall 35 of the main vessel portion 34 so as to completely close the clearance 88 between them.

The processing vessel according to the present invention can be applied to the above-mentioned washing system (in which the processing vessels are arranged side by side in line). In addition, the system can be conveniently conducted using apparatus such as is disclosed in U.S. patent application Ser. No. 07/791,137 filed Nov. 11, 1991 by Yuji KAMIKAWA and U.S. patent application Ser. No. 07/862,357 filed Apr. 2, 1992 by Kinya UENO, the teachings of which are hereby incorporated by reference.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A processing vessel for use in a washing apparatus for washing a plurality of substrates in a washing solution, comprising:
   a washing solution supply mechanism for supplying the washing solution to wash the substrate;
   a main vessel portion including at least one inlet formed in a bottom portion of the main vessel, the inlet communicating with the washing-solution supply mechanism;
   a boat for holding the substrates, which are to be washed, in a center area of the main vessel; and
   a flow control assembly arranged between the inlet and the substrates, wherein the flow control assembly comprises:
   a scattering plate for scattering the washing solution, which is introduced from the inlet, in a horizontal direction, and
   at least one pair of side plates provided at both sides of the scattering plate, the side plates and the scattering plate defining introduction flow passage for permitting most of the washing solution to flow into spaces between the substrates.

2. The processing vessel according to claim 1, wherein the side plates and the scattering plate form guiding passages between each side plate and the scattering plate.

3. The processing vessel according to claim 2, wherein each side plate is tilted relative to the horizontal plane by an angle $\theta$ in such a way that one side thereof which is located at a center of the main vessel portion is lower than another side thereof which is located at a side wall side of the main vessel portion.

4. The processing vessel according to claim 3, wherein the bottom of the main vessel portion is tilted downward at the center portion thereof and relative to the horizontal plane by an angle $\theta$.

5. The processing vessel according to claim 4, wherein the bottom of said main vessel portion includes a plurality of stepped portions.

6. The processing vessel according to claim 2, wherein the at least one pair of side plates comprise a pair of right and left side plates which are arranged on both sides of the scattering plate.

7. The processing vessel according to claim 2, wherein the pair of right side plates and the pair of left side plates are arranged on both sides of the scattering plate and form the guiding passages between the pair of right side plates and between the pair of left side plates.

8. The processing vessel according to claim 2, wherein side ends of each side plate which is located on a center side of the main vessel portion are bent downward.

9. The processing vessel according to claim 1, wherein said at least one inlet comprises two inlets and a distance between said inlets is equal to a sum of regular intervals of one of twenty and thirty sheets of said substrates on the boat.

10. The processing vessel according to claim 1, which comprises an overflow vessel portion communicated with said washing solution supply mechanism for receiving therein washing solution which flows over the top of said main vessel portion.

* * * * *